(12) United States Patent
Clerc et al.

(10) Patent No.: US 8,672,272 B2
(45) Date of Patent: Mar. 18, 2014

(54) COATING FOR PREVENTION OF ELECTROSTATIC DISCHARGE WITHIN AN EQUIPMENT IN A SPATIAL ENVIRONMENT

(75) Inventors: Sébastien Clerc, Mouans Sartoux (FR); Thierry Dargent, Auribeau sur Siagne (FR)

(73) Assignee: Thales, Neuilly-sur-Seine (FR)

( * ) Notice: Subject to any disclaimer, the term of this patent is extended or adjusted under 35 U.S.C. 154(b) by 2310 days.

(21) Appl. No.: 11/312,564

(22) Filed: Dec. 21, 2005

(65) Prior Publication Data

US 2006/0169844 A1    Aug. 3, 2006

(30) Foreign Application Priority Data

Dec. 22, 2004    (EP) .................................... 04293101

(51) Int. Cl.
*B64G 1/44* (2006.01)
(52) U.S. Cl.
USPC ........................................................ 244/172.7
(58) Field of Classification Search
USPC ............ 244/168, 172.7, 172.8; 136/291–293, 136/243–244, 253–254
See application file for complete search history.

(56) References Cited

U.S. PATENT DOCUMENTS

| | | | | |
|---|---|---|---|---|
| 3,871,902 A | * | 3/1975 | Leinkram et al. | 427/295 |
| 3,975,632 A | * | 8/1976 | Glass et al. | 250/214 SG |
| 5,594,325 A | * | 1/1997 | Manner | 323/282 |
| 6,068,218 A | * | 5/2000 | Cosner et al. | 244/172.7 |
| 6,177,629 B1 | | 1/2001 | Katz | |
| 6,260,808 B1 | | 7/2001 | Bodeau | |
| 6,394,395 B1 | * | 5/2002 | Poturalski et al. | 244/172.7 |
| 6,577,130 B1 | * | 6/2003 | Adamo et al. | 324/348 |

OTHER PUBLICATIONS

Database WPI, Section CH, Week 198605, Derwent Publications Ltd., London, GB, AN 1986-032452, XP002346889 corresponding to JP 60 253537 A (Mitsubishi Denki KK) dated Dec. 14, 1995.
S. Kawakita et al, "Influence of high energy electrons and protons on secondary electron emission of cover glasses for space solar cells", Proceedings of the 20th International on Discharges and Electrical Insulation on Vacuum. ISDEIV. Tours, France, Jul. 1-5, 2002, IEEE International Symposium on Discharges and Electrical Insulation in Vacuum, New York, NY IEEE, Jul. 1, 2002, pp. 84-87, XP010599363.

* cited by examiner

*Primary Examiner* — Tien Dinh
(74) *Attorney, Agent, or Firm* — Sughrue Mion, PLLC

(57) ABSTRACT

A solar panel (3) having a front face (31) for receiving solar radiation and a rear face (32), for use in a spacecraft (1). The solar panel is covered on the rear face (32) with a coating (4) having negative electric charge emissive property such that in use the coating expels electrons out of the rear face (32) of the solar panel (3), thus reducing the potential difference between the front face (31) and the rear face (32). A method of reducing potential difference between the front face (31) and the rear face (32) of the solar panel (3) by covering the rear face by said coating (4).

9 Claims, 2 Drawing Sheets

COATING FOR PREVENTION OF ELECTROSTATIC DISCHARGE WITHIN AN EQUIPMENT IN A SPATIAL ENVIRONMENT

This application is based on and claims the benefit of European Patent Application No. 04293101.4 filed on Dec. 22, 2004, which is incorporated by reference herein.

The present invention relates to prevention of electrostatic discharge within a spacecraft, for example in a satellite, such spacecraft using solar panels for powering of its payload, or other parts thereof which could need electrical charge such as an on-board battery.

BACKGROUND OF THE INVENTION

The use of solar panels in spacecrafts such as satellites is widely known. These equipment once placed in operation position, for example a satellite being placed in the orbit, are usually subject to effects caused by the space environment in which they are positioned. Among the various effects in the space environment, an important one is the surface electrical charging which is caused by the accumulation of electric charge on the surface of the spacecraft. One of the sources for causing such surface electrical charging is the solar radiation.

Solar panels used on spacecrafts are subject to solar radiation and therefore are very likely to suffer from accumulation of electric charge on their surface. The surface of a solar panel is usually covered with a glass material, the so called "cover glass".

The cover glass of solar panels are therefore charged with such electric charge where this charge is positive with respect to the mass (ground) of the spacecraft. As it is known, the positive charge is accumulated due to the effect of a strong photoemission current caused by the action of expelling of electrons (caused by solar radiation). Another source of positive charge is the secondary electron emission (SEE) or extraction of electrons due to the impact of energetic electrons from the space environment. In practice, typical materials used for cover glass and surface treatments give rise to a high SEE yield.

The cover glass material is also highly resistive, hence the surface of the cover glass is electrically isolated from the mass of the spacecraft.

On the other hand, the rear face of the solar panel, the "dark" side, which is electrically connected to the mass of the spacecraft, is charged negatively. For example in the case of a satellite the rear face of the solar panel is usually made of a conductive material with a very low emissive property of the negative electric charge. As a result, energetic electrons from the plasma are captured by the conductive part giving rise to an accumulation of negative charge.

In consequence, a relatively large accumulation of the positive charge on the front surface with respect to the negative charge on the mass can cause electrostatic discharge between the surface and the mass which can damage seriously the circuitry in the spacecraft. In practice, about 500 V is generally considered as a typical threshold value for producing a discharge. In order to avoid such undesired electrostatic discharge certain solutions are already known. One of such known solutions is to cover the cover glass with a conductive coating which is then connected to the "earth" of the spacecraft. However the costs involved in this solution are very high. Furthermore, the lifetime of the conductor coating is relatively limited, which makes this solution not advisable for spacecraft with a long lifetime.

Another known solution for the above problem is that of using a neutralizer. This is done by using a gun which is charged with neutralizing material such as electrons, cold positive ions or cold plasma (plasma being an ionized gas having equal amounts of positive and negative charges). The gun "shoots" a specific amount of electrons, ions or plasma in the vicinity of the spacecraft in order to neutralize the charge accumulated on the surface of the spacecraft. However this solution suffers from a high cost involved in its implementation and operation, and its low effectiveness, especially in the case where electrons are used.

A further solution for avoiding electrostatic discharge is known from U.S. Pat. No. 6,243,243. According to the solution disclosed in this document the spacecraft ground terminal and the solar panel array are coupled together through a directional high impedance device that increases the impedance in the direction from the solar panel array to ground and in this manner prevents any potential differences on the spacecraft from completing an electrical path into the ground terminal thus preventing electrostatic discharge between the solar panel array and the ground terminal. However this solution is more directed toward reducing the impact of the potential difference caused by electric charge accumulation rather than avoiding it because the potential difference, according to this solution, is not prevented from being built-up.

It is therefore desired to provide a solution for preventing electrostatic discharge without the above drawbacks.

DESCRIPTION OF THE INVENTION

The above objective is reached by using the solution proposed by the present invention according to which the potential difference between the surface charge of the cover glass on the solar panel and the rear face of the solar panel, thus the mass of the spacecraft, is maintained within relatively safe limits such that electrostatic discharge is substantially avoided.

The solution is achieved by using a coating which covers the rear face of the solar panel, the coating having strong emissive property such that the by such emissive property the negative charge is expelled out of the rear face of the solar panel leaving the rear face of the solar panel with a balance of positive charge (because of a reduced negative charge). By having an overall positive charge—because of the diminishing the negative charge—on the rear face, the accumulation of the positive charge on the front surface of the cover glass on the solar panel which faces the solar radiation does not cause a potential difference between the two faces, or at least if a potential difference is built-up, it will be maintained at a minimum value or a predetermined value being lower than a level at which an electrostatic discharge could be produced.

Accordingly one object of the present invention is that of providing a solar panel for a spacecraft the solar panel having a front face and a rear face, the front face adapted for receiving solar radiation, characterized in that the rear face of the solar panel is covered with a coating, the coating having negative electric charge emissive property.

Another object of the present invention is that of providing a spacecraft comprising at least one solar panel, the solar panel having a front face and a rear face, the front face adapted for receiving solar radiation, characterized in that the rear face of the solar panel is covered with a coating, the coating having negative electric charge emissive property.

A further object of the present invention is that of providing a method of reducing potential difference between a front face and a rear face of a solar panel, the front face receiving solar radiation, the method comprising:

covering the rear face of the solar panel with a coating, the coating having negative electric charge emissive property; and expelling negative electric charge through said coating out of the rear face of the solar panel.

A still further object of the present invention is that of using a coating having negative electric charge emissive property in a solar panel.

These and further features and advantages of the present invention are explained in more detail in the following description as well as in the claims with the aid of the accompanying drawings.

EXAMPLE OF A PREFERRED EMBODIMENT

In the following description, the example of a preferred embodiment is provided in relation to the use of solar panels in a satellite. However, the invention is not to be construed as being limited to satellite application only as those skilled in the related art are aware that the invention is equally applicable to other spacecraft which use solar panels.

Figure 1:
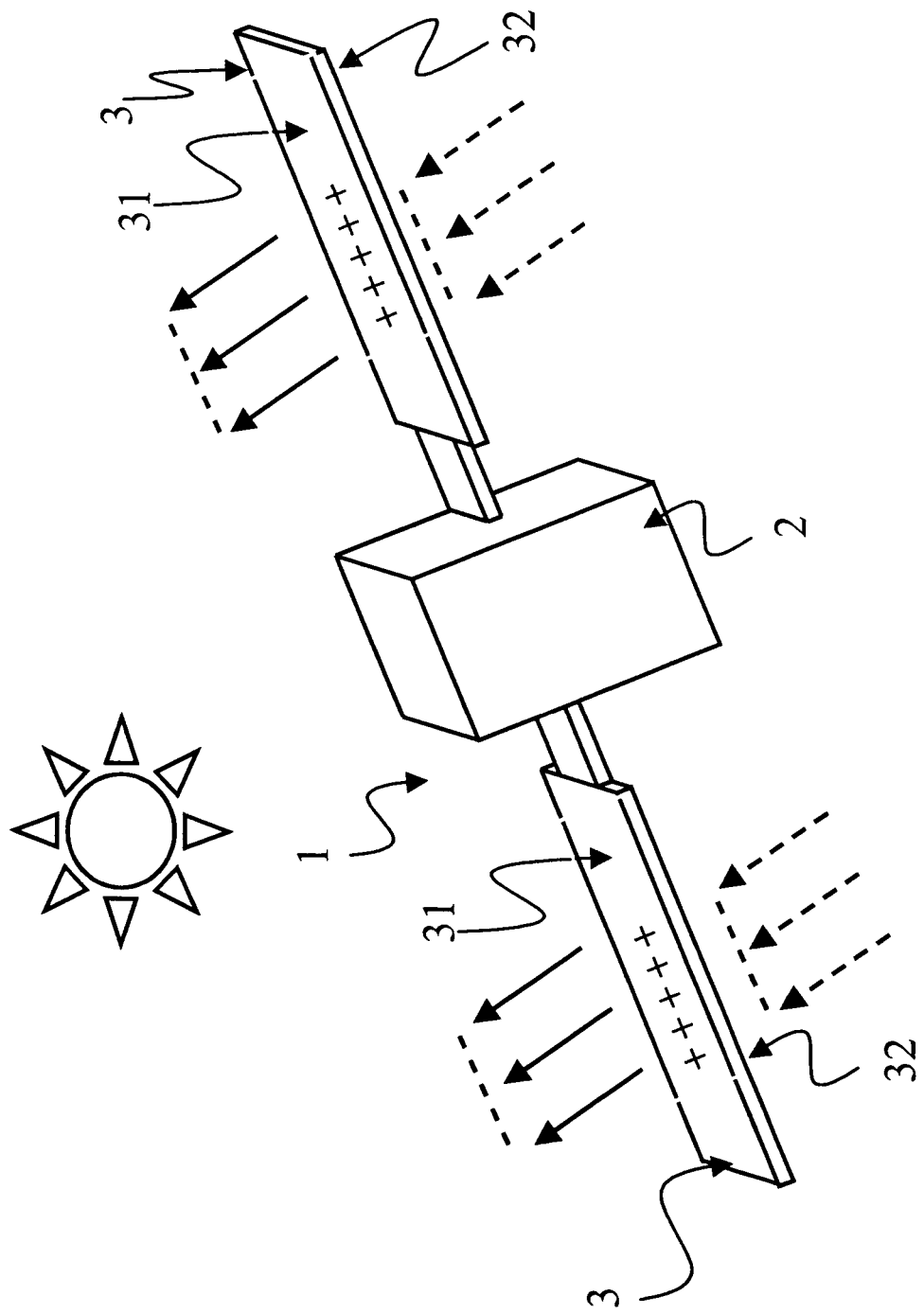
FIG. 1 is a simplified schematic representation of a satellite with solar panels deployed at each side thereof.

Referring to FIG. 1, there is shown a satellite 1 having a main body 2 and solar panels 3. Other parts of the satellite, such as for example antennas, are not shown for the sake of simplicity of description as they do not affect the understanding of the solution herein presented. As described above, a solar panel has a front face and a rear face. In the scheme shown in FIG. 1, the respective front faces of the solar panels 3 are shown by reference numeral 31 at each side. Likewise the respective rear faces are shown by reference numeral 32 at each side.

The front face 31 of each solar panel receives the solar radiation from the sun and as a consequence expels electrons due to photoemission effect. This effect is shown in FIG. 1 by means of groups of arrows pointing outwards with respect to the solar panel and showing negative charges leaving the solar panel. As a result of electron (negative charge) expulsion, the balance of charge on the front face becomes positive as shown on the surface of the front face 31 of the solar panels.

Conversely, the rear part 32 which is made of a conductive material absorbs electrons from the surrounding plasma and therefore the balance of charge on the rear face becomes negative. This effect is represented in the figure by means of broken arrows pointing toward the solar panel's rear side 32 and showing negative charge being absorbed by the solar panels 3.

Figure 2:
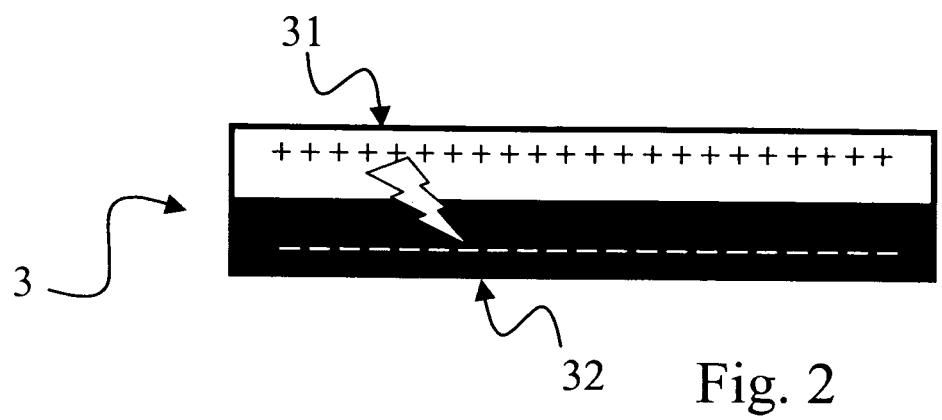
FIG. 2 is a schematic cross-sectional representation of a solar panel showing the respective cross-sections of the front face and the rear face of the solar panel.

FIG. 2 represents a cross-section of the solar panel with the front face 31 and the rear face 32 each charged with positive and negative charges respectively and the hazard of a discharge is represented between the two faces.

Figure 3:
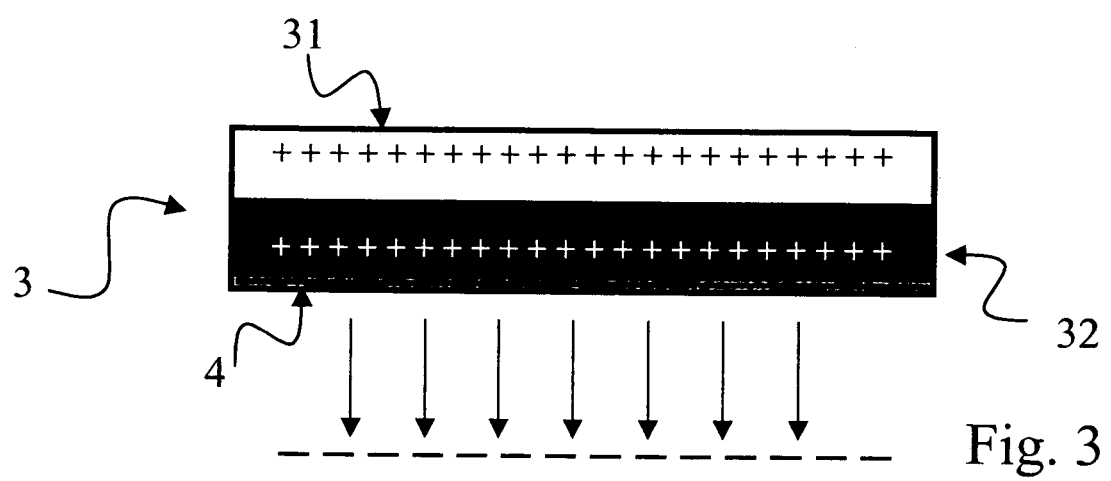
FIG. 3 is a schematic cross-sectional representation of the solar panel of FIG. 2 with a coating having emissive property according to the present invention.

According to the invention the rear face 32 of the solar panel 3 is covered with a coating 4 as shown in FIG. 3 by means of a dashed region. The coating 4 has a negative electric charge emissive property.

As described further above, the negative charge emissive property of the coating 4 causes expulsion of electrons from the rear face 32. This effect is shown in FIG. 3 by means of a group of arrows pointing outwards with respect to the solar panel and showing negative charges leaving the rear face 32. As a consequence, the rear face 32 of the solar panel is left with a positive balance of charges as shown in the figure.

Therefore the potential difference between the front face 31 and the rear face 32 of the solar panel becomes either negligible or it is maintained at a minimum level, and in any case below a discharge threshold value. As mentioned above, a typical discharge threshold voltage is about 500 V. Thus the coating should be chosen and installed such that the potential difference built up between the front face 31 and the rear face 32 is maintained below this value so as to avoid the possibility of discharge. An example of a preferred value for the potential difference would be 100 V which is well below the discharge threshold voltage value.

The criterion however should preferably be based on selecting the material and other physical characteristics of the coating such that substantially equal levels of emissive property are obtained for the front face and the rear face (with the coating in place on the rear face).

As regard the material for the coating 4, any emissive and conductive (or weak isolating) material is suitable for use. One example of such coating material is magnesium fluoride ($MgF_2$) used as anti-reflecting material on the cover glass. Magnesium Fluoride has a high SEE yield (estimated at 5.5 for electrons of 1 keV). This coating material has a low cost and a relatively long lifetime. It usually comprises a thin layer (about 1 micron) of $MgF_2$ which can be deposited for example by vacuum evaporation on the back side of the solar array panels. The added weight of the layer is of the order of a few grams per squared meter.

Alternatively, the $MgF_2$ layer can be deposited on a thin polymer film with a low resistivity stuck on the solar panel.

Other non-limiting examples of materials suitable for coating are Aluminum Oxide ($Al_2O_3$, maximum yield 3.2), Silicon dioxide ($SiO_2$, maximum yield 3.2), or conductive white paint PSG 120 FD (maximum yield 2.85) all being well known and commercially available material.

In addition to low cost, another advantage of the solution of the present invention is the simplicity as regards its putting into practice.

A further advantage is the use of only passive material in the present solution.

As it has been already mentioned, the above example of a preferred embodiment has been provided in relation to a satellite, however the invention is equally applicable to other types of spacecraft such as manned spacecraft or interplanetary or intergalactic probes.

The invention claimed is:

1. A solar panel (3) for a spacecraft (1) the solar panel having a front face (31) and a rear face (32), the front face adapted for receiving solar radiation, characterized in that the rear face (32) of the solar panel is covered with a coating (4), the coating having negative electric charge emissive property so that said coating causes expulsion of electrons from said rear face to leave said rear face with a balance of positive charge.

2. A solar panel according to claim 1, wherein a phase difference between an overall electric charge on the front surface (31) and an overall electric charge on the rear face (32) is maintained at a minimum value or below a predetermined value such that the minimum value or the predetermined value is lower than a level at which an electrostatic discharge could be produced between the front face (31) and the rear face (32).

3. A solar panel according to claim 1 wherein the coating (4) is of emissive and conductive material or of a weak isolating material.

4. A solar panel according to claim 3 wherein the coating (4) has physical characteristic such that the level of emissive property for the front face (31) is substantially equal to the emissive property of the rear face (32) of the panel when the coating in place on the rear face (32).

5. A solar panel according to claim 1 wherein the material of the coating (4) is made of magnesium fluoride —$MgF_2$— or aluminum oxide ($Al_2O_3$, maximum yield 3.2), silicon dioxide ($SiO_2$, maximum yield 3.2), or conductive white paint PSG 120 FD (maximum yield 2.85).

6. A spacecraft (1) comprising at least one solar panel (3), the solar panel (3) having a front face (31) and a rear face (32), the front face adapted for receiving solar radiation, characterized in that the rear face (32) of the solar panel is covered with a coating (4), the coating having negative electric charge emissive property so that said coating causes expulsion of electrons from said rear face to leave said rear face with a balance of positive charge.

7. A spacecraft (1) according to claim 6 wherein a phase difference between an overall electric charge on the front surface (31) and an overall electric charge on the rear face (32) is maintained at a minimum value or below a predetermined value such that the minimum value or the predetermined value is lower than a level at which an electrostatic discharge could be produced between the front face (31) and the rear face (32).

8. A spacecraft according to claim 6, wherein said coating causes expulsion of electrons from said rear face to leave said rear face with a balance of positive charge.

9. A solar panel for a spacecraft, said solar panel having a front face and a rear face, the front face adapted for receiving solar radiation, characterized in that the rear face of the solar panel is covered with a coating which does not cover said front face, said coating having negative electric charge emissive property.

* * * * *